United States Patent
Kim et al.

(10) Patent No.: US 12,190,928 B2
(45) Date of Patent: Jan. 7, 2025

(54) MAGNETORESISTIVE RANDOM ACCESS MEMORY DEVICE HAVING A METAL LAYER DOPED WITH A MAGNETIC MATERIAL

(71) Applicant: SAMSUNG ELECTRONICS CO., LTD., Suwon-si (KR)

(72) Inventors: Younghyun Kim, Seoul (KR); Sechung Oh, Yongin-si (KR); Heeju Shin, Seoul (KR); Jaehoon Kim, Seoul (KR); Sanghwan Park, Suwon-si (KR); Junghwan Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 239 days.

(21) Appl. No.: 17/970,788

(22) Filed: Oct. 21, 2022

(65) Prior Publication Data
US 2023/0186963 A1    Jun. 15, 2023

(30) Foreign Application Priority Data
Dec. 13, 2021  (KR) .......................... 10-2021-0177748

(51) Int. Cl.
| | | |
|---|---|---|
| *G11C 11/00* | (2006.01) | |
| *G11C 11/16* | (2006.01) | |
| *H10B 61/00* | (2023.01) | |
| *H10N 50/10* | (2023.01) | |
| *H10N 50/80* | (2023.01) | |
| *H10N 50/85* | (2023.01) | |

(52) U.S. Cl.
CPC ...... *G11C 11/1673* (2013.01); *G11C 11/1653* (2013.01); *H10B 61/22* (2023.02); *H10N 50/10* (2023.02); *H10N 50/80* (2023.02); *H10N 50/85* (2023.02)

(58) Field of Classification Search
CPC .................................................... G11C 11/161
USPC ........................................................ 365/158
See application file for complete search history.

(56) References Cited

U.S. PATENT DOCUMENTS

| | | |
|---|---|---|
| 8,084,835 B2 | 12/2011 | Ranjan et al. |
| 8,852,760 B2 | 10/2014 | Wang et al. |
| 10,121,961 B2 | 11/2018 | Apalkov et al. |
| 10,840,435 B2 | 11/2020 | Sonobe et al. |
| 11,088,319 B2 | 8/2021 | Kim et al. |
| 2010/0109109 A1* | 5/2010 | Chen ............... H10N 50/10 |
| | | 257/E29.323 |
| 2010/0309580 A1* | 12/2010 | Tonooka ............ G11B 5/7379 |
| | | 428/800 |
| 2020/0076369 A1* | 3/2020 | Nunn ................ G11C 11/1673 |

(Continued)

FOREIGN PATENT DOCUMENTS

CN           112635651 A      4/2021

*Primary Examiner* — Hoai V Ho
(74) *Attorney, Agent, or Firm* — Muir Patent Law, PLLC

(57) ABSTRACT

A magnetoresistive random access memory device includes a pinned layer; a tunnel barrier layer on the pinned layer; a free layer structure on the tunnel barrier layer, the free layer structure including a plurality of magnetic layers and a plurality of metal insertion layers between the magnetic layers; and an upper oxide layer on the free layer structure, wherein each of the metal insertion layers includes a non-magnetic metal material doped with a magnetic material, and the metal insertion layers are spaced apart from each other.

20 Claims, 13 Drawing Sheets

(56) References Cited

U.S. PATENT DOCUMENTS

2020/0227628 A1\* 7/2020 Wang .................... H01F 41/302
2020/0251650 A1\* 8/2020 Kim ...................... H10B 61/22

\* cited by examiner

MAGNETORESISTIVE RANDOM ACCESS MEMORY DEVICE HAVING A METAL LAYER DOPED WITH A MAGNETIC MATERIAL

CROSS-REFERENCE TO RELATED APPLICATION

This application claims priority under 35 USC § 119 to Korean Patent Application No. 10-2021-0177748, filed on Dec. 13, 2021, in the Korean Intellectual Property Office (KIPO), the contents of which are incorporated by reference herein in their entirety.

BACKGROUND

1. Field

Embodiments relate to a magnetoresistive random access memory (MRAM) device.

2. Description of the Related Art

An electronic device may have high-speed and low-power, and a memory device embedded in the electronic device may also have fast read/write operations and low operating voltage.

SUMMARY

The embodiments may be realized by providing a magnetoresistive random access memory device including a pinned layer; a tunnel barrier layer on the pinned layer; a free layer structure on the tunnel barrier layer, the free layer structure including a plurality of magnetic layers and a plurality of metal insertion layers between adjacent ones of the plurality of magnetic layers; and an upper oxide layer on the free layer structure, wherein each metal insertion layer of the plurality of metal insertion layers includes a non-magnetic metal material doped with a magnetic material, and the plurality of metal insertion layers are spaced apart from each other.

The embodiments may be realized by providing a magnetoresistive random access memory device including a pinned layer; a tunnel barrier layer on the pinned layer; a free layer structure on the tunnel barrier layer; and an upper oxide layer on the free layer structure; wherein the free layer structure includes a first magnetic layer, a first metal insertion layer on the first magnetic layer, the first metal insertion layer including a first non-magnetic metal material doped with a first magnetic material, a second magnetic layer on the first metal insertion layer, a second metal insertion layer on the second magnetic layer, the second metal insertion layer including a second non-magnetic metal material doped with a second magnetic material, and a third magnetic layer on the second metal insertion layer.

The embodiments may be realized by providing a magnetoresistive random access memory device including a pinned layer; a tunnel barrier layer on the pinned layer; a free layer structure on the tunnel barrier layer; and an upper oxide layer on the free layer structure, wherein the free layer structure includes a first magnetic layer having perpendicular magnetic anisotropy and including a ferromagnetic material, a first metal insertion layer on the first magnetic layer, the first metal insertion layer including a first non-magnetic metal material doped with a first magnetic material, a second magnetic layer on the first metal insertion layer, the second magnetic layer having perpendicular magnetic anisotropy and including a ferromagnetic material, a second metal insertion layer on the second magnetic layer, the second metal insertion layer including a second non-magnetic metal material doped with a second magnetic material, and a third magnetic layer on the second metal insertion layer, the third magnetic layer having perpendicular magnetic anisotropy and including a ferromagnetic material.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
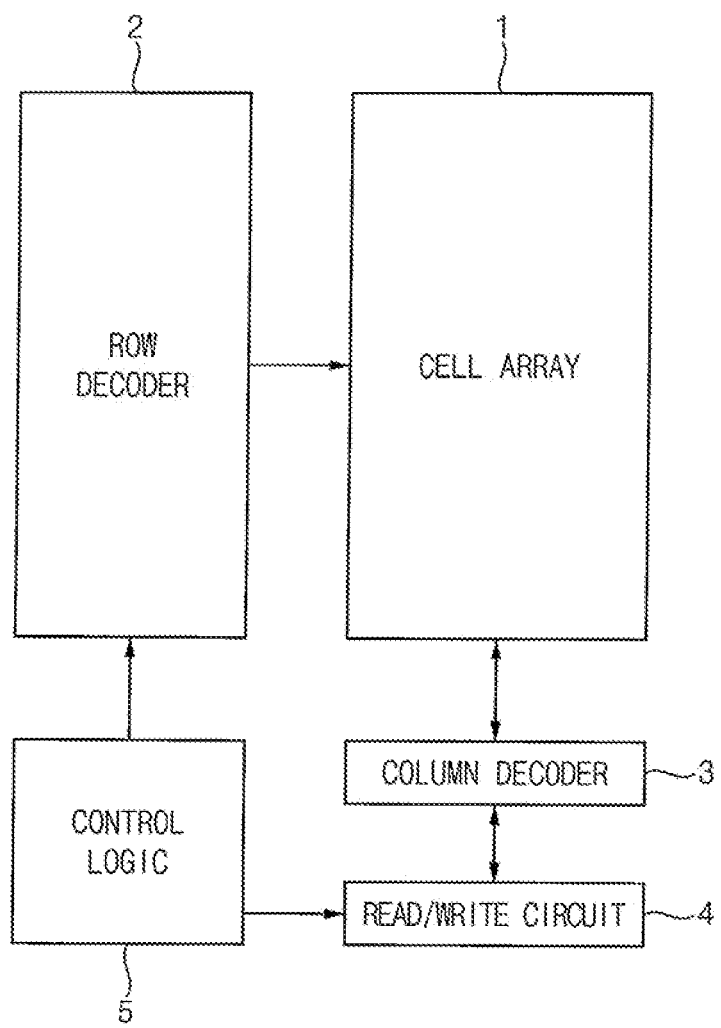
FIG. 1 is a block diagram of an MRAM device in accordance with example embodiments.

FIG. 1 is a block diagram of an MRAM device in accordance with example embodiments.

Referring to FIG. 1, the MRAM device may include a cell array 1, a row decoder 2, a column decoder 3, and a read/write circuit 4 and a control logic 5.

The cell array 1 may include a plurality of word lines, a plurality of bit lines and memory cells. The memory cells may be connected at cross points the word lines and the bit lines, respectively. The cell array 1 will described below with reference to FIG. 2.

The row decoder 2 may be connected to the cell array 1 by the word lines. The row decoder 2 may decode addresses input from an outside, and thus one of the plurality of word lines may be selected.

The column decoder 3 may be connected to the cell array 1 by the bit lines. The column decoder 3 may decode addresses input from the outside, and thus one of the bit lines may be selected. The bit line selected by the column decoder 3 may be connected to a read/write circuit 4.

The read/write circuit 4 may supply a bit line bias for accessing a selected memory cell by controlling of the control logic 5. In an implementation, the read/write circuit 4 may supply the bit line bias to a selected bit line for writing or reading data at the selected memory cell.

The control logic 5 may output control signals for controlling the MRAM device according to a command signal supplied from the outside. The control signals output from the control logic 5 may control the read/write circuit 4.

Figure 2:
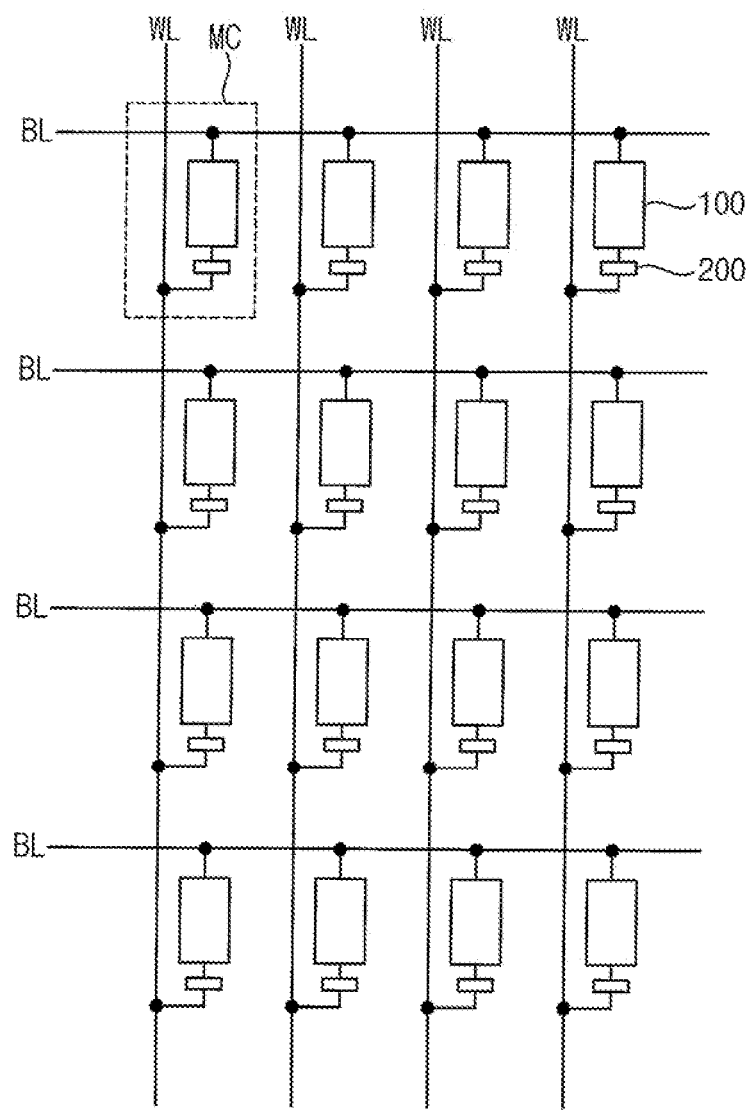
FIG. 2 is a circuit diagram of a cell array of an MRAM device in accordance with example embodiments.
Figure 3:
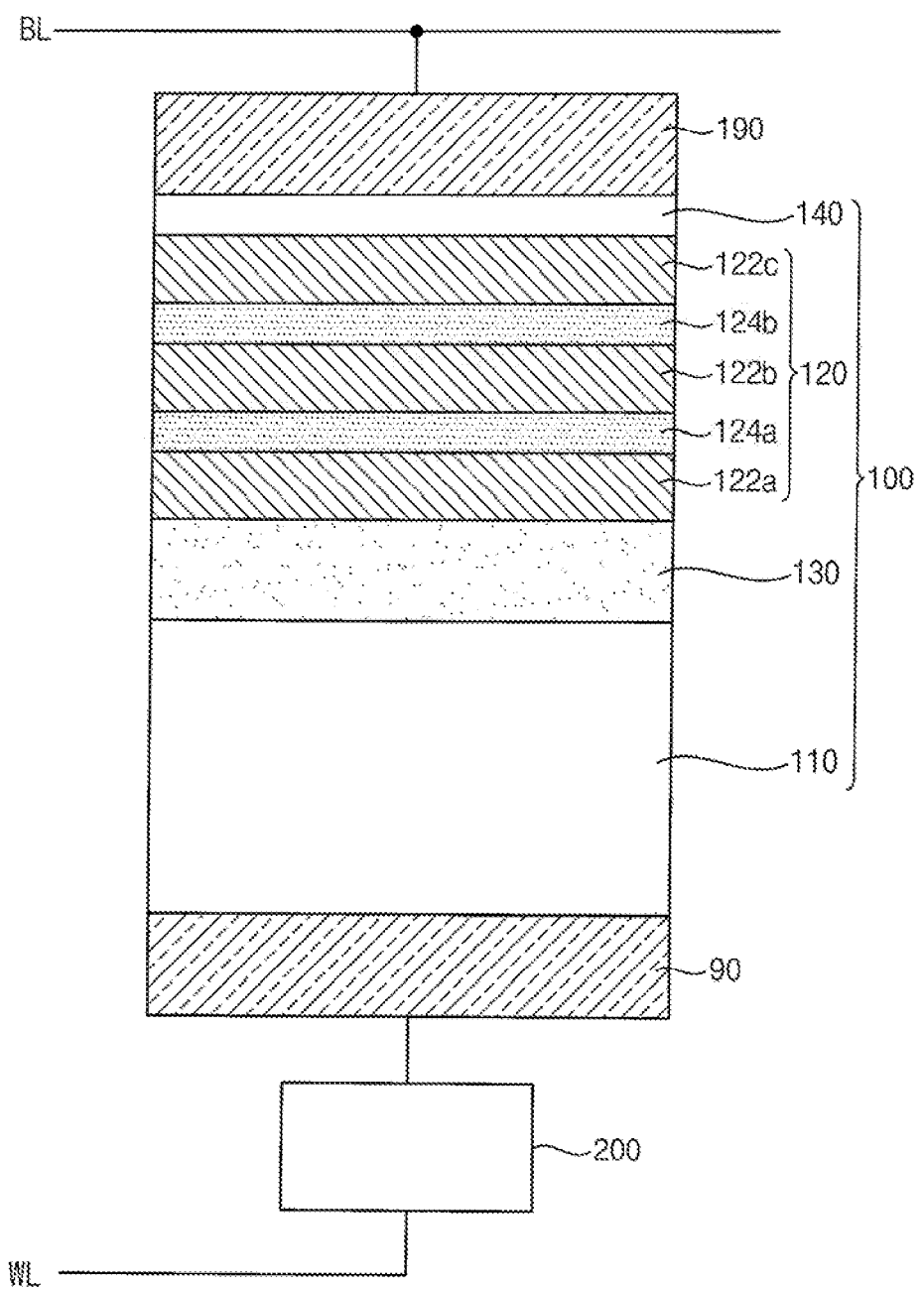
FIG. 3 is a conceptual diagram of a unit memory cell of the MRAM device in accordance with example embodiments.

FIG. 2 is a circuit diagram of a cell array of an MRAM device in accordance with example embodiments. FIG. 3 is a conceptual diagram of a unit memory cell of the MRAM device in accordance with example embodiments.

Referring to FIGS. 2 and 3, the cell array 1 may include a plurality of bit lines BL, a plurality of word lines WL and a plurality of unit memory cells MC.

The word lines WL may extend (e.g., lengthwise) in a first direction, and the bit lines BL may extend (e.g., lengthwise) in a second direction crossing the first direction. The unit memory cells MC may be arranged in two-dimension or in three-dimension. The unit memory cells MC may be connected at cross points of word lines WL and bit lines BL, respectively. In an implementation, each of the unit memory cells MC connected to the word lines WL may be connected to the read/write circuit (4 referred to FIG. 1) by the bit lines BL.

In the MRAM device, the unit memory cell MC may include a magnetic tunnel junction (MTJ) structure 100 and a selection device 200.

The MTJ structure 100 may be connected between the bit line BL and the selection device 200, and the selection device 200 may be connected between the MTJ structure 100 and the word line WL. The MTJ structure 100 may include a pinned layer 110, a tunnel barrier layer 130, a free layer structure 120, and an upper oxide layer 140. The MTJ structure 100 will be described in greater detail below.

In an implementation, a lower electrode 90 may be under (e.g., at one side of) the MTJ structure 100, and an upper electrode 190 may be on (e.g., another side of) the MTJ structure 100. In an implementation, the pinned layer 110 may be between the lower electrode 90 and the tunnel barrier layer 130, and the free layer structure 120 may be between the tunnel barrier layer 130 and the upper electrode 190.

The selection device 200 may selectively control a flow of charges passing through the MTJ structure 100. In an implementation, the selection device 200 may include a diode, a PNP bipolar transistor, an NPN bipolar transistor, an NMOS FET (field effect transistor), or a PMOS FET. When the selection device 200 includes a three-terminal device such as a bipolar transistor or a MOS FET, an additional wiring may be connected to the selection device 200. As used herein, the term "or" is not an exclusive term, e.g., "A or B" would include A, B, or A and B.

The MTJ structure 100 may serve as a variable resistance element that may have one of two resistance states according to an electrical signal applied thereto. In an implementation, when a magnetization direction of the pinned layer 110 and a magnetization direction of the free layer structure 120 are parallel, the MTJ structure 100 may have a low resistance, and the state may be referred to as data '0'. When the magnetization direction of the pinned layer 110 and the magnetization direction of the free layer structure 120 are anti-parallel, the MTJ structure 100 may have a high resistance, and the state may be referred to as data '1'.

Figure 4:
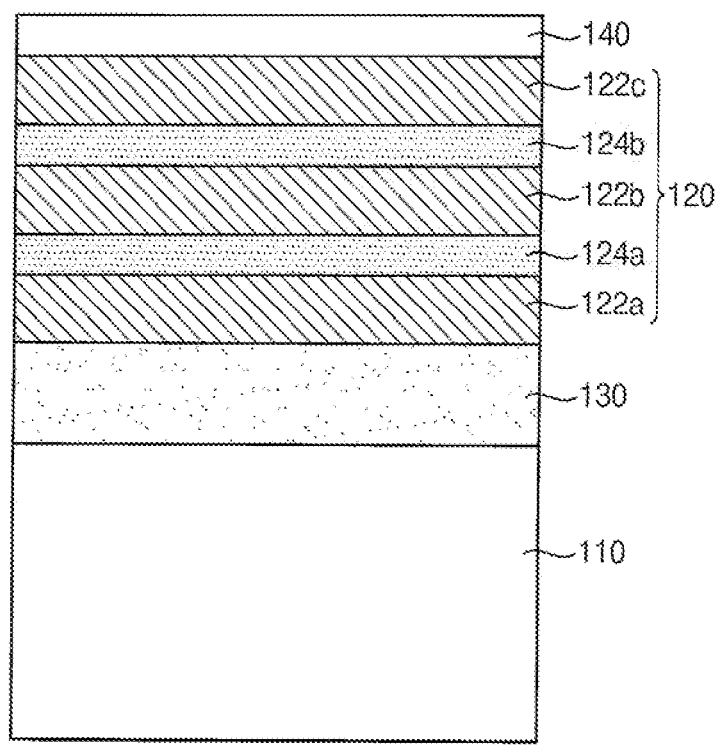
FIG. 4 is a cross-sectional view of a MTJ structure in an MRAM device in accordance with example embodiments.
Figure 5A:
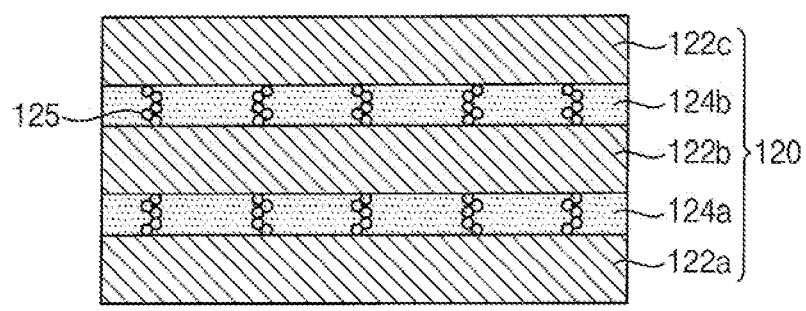
FIGS. 5A, 5B, and 5C are cross-sectional views, respectively, of a distribution of a doped magnetic material in a metal insertion layer of a free layer structure in accordance with example embodiments.
Figure 5B:
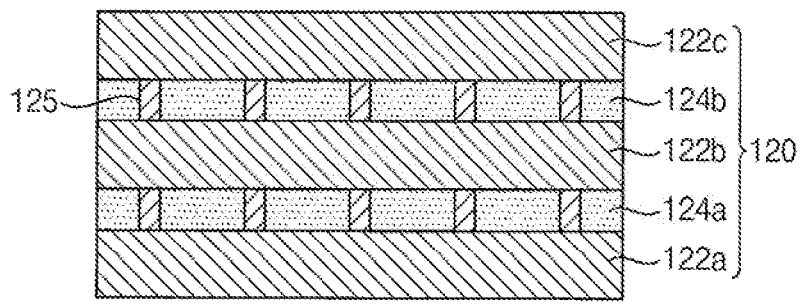
Figure 5C:
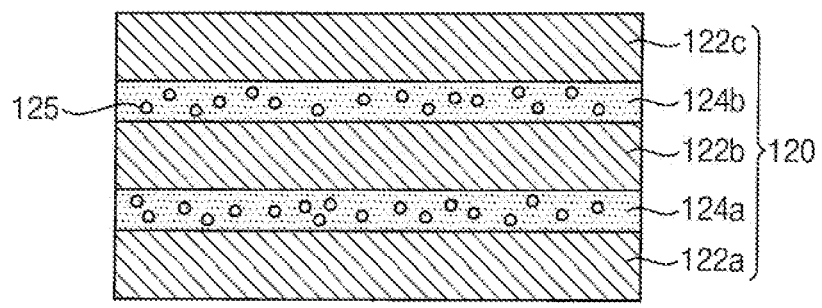

FIG. 4 is a cross-sectional view of a MTJ structure in an MRAM device in accordance with example embodiments. FIGS. 5A, 5B, and 5C are cross-sectional views, respectively, of a distribution of a doped magnetic material in a metal insertion layer of a free layer structure in accordance with example embodiments.

Referring to FIG. 4, the MTJ 100 may include the pinned layer 110, the tunnel barrier layer 130, the free layer structure 120, and the upper oxide layer 140 sequentially stacked.

The pinned layer 110 may have a fixed magnetization direction. In an implementation, the magnetization direction of the pinned layer 110 may be fixed, regardless of program currents passing through the pinned layer 110. The pinned layer 110 may have perpendicular magnetic anisotropy (PMA). In an implementation, the pinned layer 110 may have a magnetization easy axis in a direction perpendicular to an upper surface of the pinned layer 110.

The pinned layer 110 may include a ferromagnetic material. In an implementation, the pinned layer 110 may include, e.g., an amorphous rare earth element alloy, a multilayer in which a ferromagnetic metal (FM) and a non-magnetic metal (NM) are alternately stacked, a cobalt alloy, or combinations thereof. The amorphous rare earth element alloy may include, e.g., TbFe, TbCo, TbFeCo, DyTbFeCo, or GdTbCo. Layers included in the multilayer may include, e.g., Co/Pt, Co/Pd, CoCr/Pt, Co/Ru, Co/Os, Co/Au, Ni/Cu, or the like. The cobalt alloy may include, e.g., CoCr, CoPt, CoCrPt, CoCrTa, CoCrPtTa, CoCrNb, or CoFeB. In an implementation, the pinned layer 110 may include a CoFeB single layer.

The tunnel barrier layer 130 may be between the pinned layer 110 and the free layer structure 120. The tunnel barrier layer 130 may serve as an insulated tunnel barrier for generating quantum mechanical tunneling between the pinned layer 110 and the free layer structure 120.

The tunnel barrier layer 130 may include, e.g., magnesium oxide (MgO), aluminum oxide ($Al_2O_3$), silicon oxide ($SiO_2$), tantalum oxide ($Ta_2O_5$), silicon nitride (SiN), aluminum nitride (AlN), or the like. In an implementation, the tunnel barrier layer 130 may include magnesium oxide.

The free layer structure 120 may include a plurality of magnetic layers 122a, 122b, and 122c, and metal insertion layers 124a and 124b between the magnetic layers 122a, 122b and 122c. In an implementation, the magnetic layers and the metal insertion layers may be alternately disposed in the free layer structure 120. The metal insertion layers 124a and 124b may include a non-magnetic metal material doped with a magnetic material.

One or a plurality of metal insertion layers 124a and 124b may be in the free layer structure 120. In an implementation, a plurality of the metal insertion layers 124a and 124b may be in the free layer structure 120. Hereinafter, the free layer structure 120 including two metal insertion layers 124a and 124b will be described.

In an implementation, as illustrated in FIG. 4, the free layer structure 120 may include a first magnetic layer 122a, a first metal insertion layer 124a, a second magnetic layer 122b, a second metal insertion layer 124b and a third magnetic layers 122c sequentially stacked.

The first and second magnetic layers 122a and 122b may be separated from each other by the first metal insertion layer 124a. In an implementation, the first metal insertion layer 124a may be continuously on the first magnetic layer 122a. The first metal insertion layer 124a may cover (e.g., completely cover) the first magnetic layer 122a.

The second and third magnetic layers 122b and 122c may be separated from each other by the second metal insertion layer 124b. In an implementation, the second metal insertion layer 124b may be continuously on the second magnetic layer 122b. The second metal insertion layer 124b may cover the second magnetic layer 122b. In an implementation, the free layer structure 120 may include a plurality of metal insertion layers 124a and 124b spaced apart from each other.

The first to third magnetic layers 122a, 122b and 122c included in the free layer structure 120 may have perpendicular magnetic anisotropy (PMA). The first to third magnetic layers 122a, 122b and 122c may include a ferromagnetic material. The first to third magnetic layers 122a, 122b and 122c may include, e.g., iron (Fe), cobalt (Co), nickel (Ni), chromium (Cr), platinum (Pt), or the like. The first to third magnetic layers 122a, 122b and 122c may include the ferromagnetic material, and may further include, e.g., boron (B), silicon (Si), or zirconium (Zr). The materials may be used alone or in combination of two or more. In an implementation, the first to third magnetic layers 122a, 122b and 122c may include a composite material, e.g., CoFe, NiFe, FeCr, CoFeNi, PtCr, CoCrPt, CoFeB, NiFeSiB, or CoFeSiB. In an implementation, the first to third magnetic layers 122a, 122b and 122c may include, e.g., CoFeB.

The non-magnetic metal material included in the first and second metal insertion layers 124a and 124b may include, e.g., molybdenum, tungsten, tantalum, ruthenium, zirconium, niobium, yttrium, scandium, vanadium, chromium, tellurium, hafnium, or the like. In an implementation, the magnetic material doped into the non-magnetic metal material may include, e.g., iron (Fe), cobalt (Co), gadolinium (Gd) or nickel (Ni),. In an implementation, the first and second metal insertion layers 124a and 124b may include, e.g., MoCoFe, WCoFe, TaCoFe, or the like. In an implementation, the first and second metal insertion layers 124a and 124b may include, e.g., MoCoFe.

The metal insertion layers 124a and 124b may be included in the free layer structure 120, and deterioration of properties of the free layer structure 120 at a high temperature, e.g., of about 400° C. or more, may be decreased. If a high-temperature process at 400° C. or more is performed, oxygen or a crystalline material could be diffused from the upper oxide layer 140 to the magnetic layers 122a, 122b and 122c included in the free layer structure 120. In an implementation, the diffusion of the oxygen or the crystalline material into the magnetic layers 122a and 122b may be prevented by the metal insertion layers 124a and 124b, so that a resistance distribution and a current distribution caused by the oxygen or the crystalline material may be decreased. In an implementation, two or more metal insertion layers 124a and 124b spaced apart from each other may be included in the free layer structure 120, and the free layer structure 120 may have an excellent heat endurance characteristic. In an implementation, the two or more metal insertion layers 124a and 124b may be included in the free layer structure 120, and the diffusion of the oxygen or the crystalline material into the magnetic layers 122a and 122b may be more effectively prevented. In an implementation, the resistance distribution and the current distribution may be improved (i.e., decreased).

In an implementation, electron spins in the free layer structure 120 may be maintained and transferred by the magnetic material doped into the metal insertion layers 124a and 124b, so that currents flowing through the free layer structure 120 may be increased during an operation of the MRAM device. In an implementation, switching currents of the MRAM device may be decreased, and a spin transfer torque (STT) efficiency may be improved.

In an implementation, each of the metal insertion layers 124a and 124b included in the free layer structure 120 may have a thickness of about 2 Å to about 10 Å. In an implementation, each of the first and second metal insertion layers 124a and 124b may have a thickness of about 2 Å to about 10 Å. If each of the metal insertion layers 124a and 124b were to have a thickness smaller than 2 Å, it could be difficult to continuously form the metal insertion layers 124a and 124b on the magnetic layer, and it could be difficult to prevent the diffusion of the oxygen or the crystalline material by the metal insertion layers 124a and 124b. If each of the metal insertion layers 124a and 124b were to have a thickness greater than 10 Å, a magnetic exchange coupling between one of the magnetic layers 122a, 122b and 122b and one of the metal insertion layers 124a and 124b adjacent thereto could be difficult.

In an implementation, the magnetic material doped into the metal insertion layers 124a and 124b may have a concentration (e.g., content) of about 5% (i.e., atomic %) to about 40% (i.e., atomic %). In an implementation, the magnetic material included in each of the first and second metal insertion layers 124a and 124b may have a concentration of about 5% to about 40%. If the magnetic material included in each of the metal insertion layers 124a and 124b were to have a concentration lower than 5%, an improvement effect of the STT efficiency could be decreased. If the magnetic material included in each of the metal insertion layers 124a and 124b were to have a concentration higher than 40%, improvement effects of the resistance distribution and the current distribution could be decreased. In an implementation, the magnetic material included in the metal insertion layers 124a and 124b may have a concentration of about 20% (i.e., atomic %) to about 40% (i.e., atomic %).

The magnetic material doped into the metal insertion layers 124a and 124b may be arranged in various forms.

In an implementation, as shown in FIG. 5A, the magnetic materials 125 doped into the metal insertion layers 124a and 124b may have a structure partially connected in a vertical direction. In an implementation, a portion of the doped magnetic materials 125 may be connected to adjacent magnetic layers 122a, 122b and 122c. Due to the doped magnetic material, the magnetic exchange coupling characteristics between one of the magnetic layers 122a, 122b and 122b and one of the metal insertion layers 124a and 124b adjacent thereto may be improved.

In an implementation, as shown in FIG. 5B, the magnetic materials 125 doped into the metal insertion layers 124a and 124b may have a structure connected to adjacent magnetic layers 122a, 122b and 122c. In an implementation, the metal insertion layers 124a and 124b may include magnetic bridge patterns penetrating the non-magnetic metal layers. The magnetic material 125 doped into the metal insertion layers 124a and 124b may be connected to the adjacent magnetic layers. Due to the doped magnetic material 125, the magnetic exchange coupling characteristics between one the magnetic layers 122a, 122b and 122b and one of the metal insertion layers 124a and 124b adjacent thereto may be improved.

In an implementation, as shown in FIG. 5C, the magnetic material 125 doped into the metal insertion layers 124a and 124b may be randomly distributed.

In an implementation, a sum of thicknesses of the magnetic layers 122a, 122b and 122c included in the free layer structure 120 may be greater than a sum of thicknesses of the metal insertion layers 124a and 124b included in the free layer structure 120.

The upper oxide layer 140 may include a material that induces interfacial magnetic anisotropy (interfacial PMA) at an interface of the third magnetic layer 122c. The upper oxide layer 140 may include a metal oxide. When the upper oxide layer 140 includes a metal oxide, oxygen atoms included in the upper oxide layer 140 may combine with a metal atom included in the third magnetic layer 122c. In an implementation, a perpendicular magnetic anisotropy may be generated at the interface of the third magnetic layer 122c.

The upper oxide layer 140 may include, e.g., magnesium oxide (MgO), magnesium aluminum oxide (MgAlO), hafnium oxide (HfO), zirconium oxide (ZrO), aluminum oxide (AlO), tantalum oxide (TaO), iridium oxide (IrO), or combinations thereof.

In an implementation, the upper oxide layer 140 may have a thickness of about 2 Å to about 15 Å.

In an implementation, the free layer structure 120 may be formed using a PVD apparatus having a multi-chamber.

In order to form the free layer structure 120, a process of forming a magnetic layer and a process of forming a metal insertion layer may be alternately performed. The process of forming the magnetic layer and the process of forming the metal insertion layer may be performed in different chambers of the PVD apparatus, and may be performed in situ without a vacuum break. In an implementation, defects between the magnetic layer and the metal insertion layer may be decreased.

The process of forming the magnetic layers 122a, 122b and 122c may include a sputtering process using a target including a material of the magnetic layers.

The process of forming the metal insertion layers 124a and 124b may include a sputtering process using a target including a material of the metal insertion layers. In an implementation, the target for forming the metal insertion layers 124a and 124b may be an alloy target including a non-magnetic metal material doped with a magnetic material. In an implementation, a plurality of targets for forming the metal insertion layers 124a and 124b may be used, and a target of a non-magnetic metal material and a target of a magnetic material may be used together.

In an implementation, the process of forming the free layer structure 120 may be performed at a temperature of about 5° C. to about 250° C.

Figure 6A:
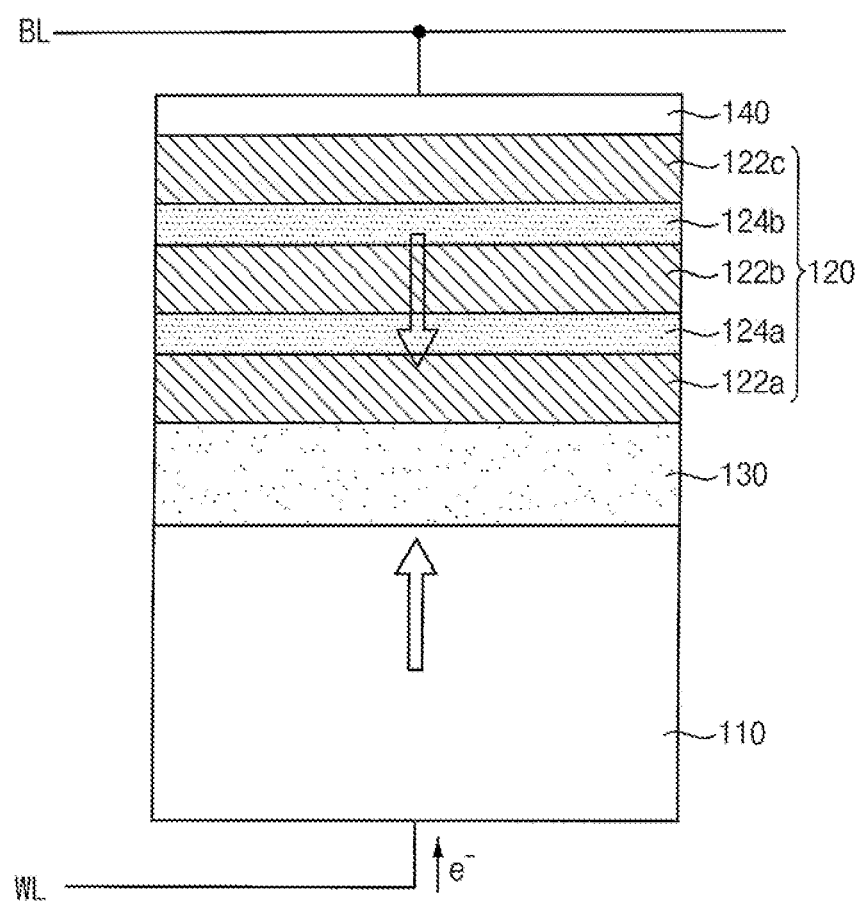
FIGS. 6A and 6B are diagrams showing operation of an MRAM device in accordance with example embodiments.
Figure 6B:
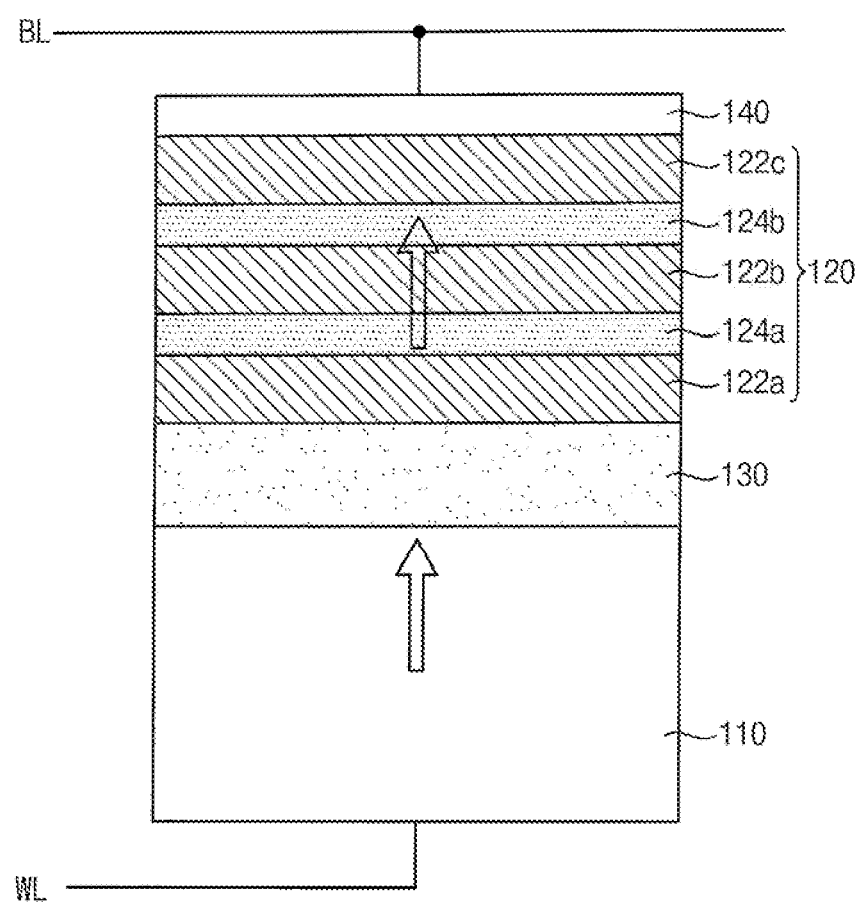

FIGS. 6A and 6B are diagrams for explaining an operation of an MRAM device in accordance with example embodiments.

Write currents may be applied to the MTJ structure 100 so that magnetization directions of the free layer structure 120 and the pinned layer 110 may be a parallel state.

In an implementation, as shown in FIG. 6A, in a state in which the magnetization directions of the free layer structure 120 and the pinned layer 110 are antiparallel, electrons (e−) may flow in a direction toward the free layer structure 120 from the pinned layer 110. In an implementation, as shown in FIG. 6B, the magnetization direction of the free layer structure 120 may be reversed by the spin transfer torque STT induced from the pinned layer 110.

In an implementation, the magnetization directions of the first to third magnetic layers 122a, 122b and 122c may be reversed by the spin transfer torque induced from the pinned layer 110. The spin transfer torque may be maintained by the first and second metal insertion layers 124a and 124b between the first to third magnetic layers 122a, 122b and 122c, and thus the magnetization directions of the first to third magnetic layers 122a, 122b and 122c may be easily reversed. In an implementation, operating currents applied to the MTJ structure 100 may be decreased, and the MRAM device may be operated by low operating currents.

In an implementation, the metal insertion layers 124a and 124b may be included in the free layer structure 120, and a thermal stability of the free layer structure 120 may be improved. In an implementation, the resistance distribution of the free layer structure 120 and a distribution of currents flowing through the free layer structure 120 may be decreased during an operation of the MRAM device.

In an implementation, the upper oxide layer 140 may be on the third magnetic layer 122c in the free layer structure 120, and the free layer structure 120 may have sufficient perpendicular magnetic anisotropy.

Hereinafter, a MTJ structure having various stacked structures may be described. For convenience of description, parts described with reference to FIGS. 3 to 6B may be briefly described or omitted.

Figure 7:
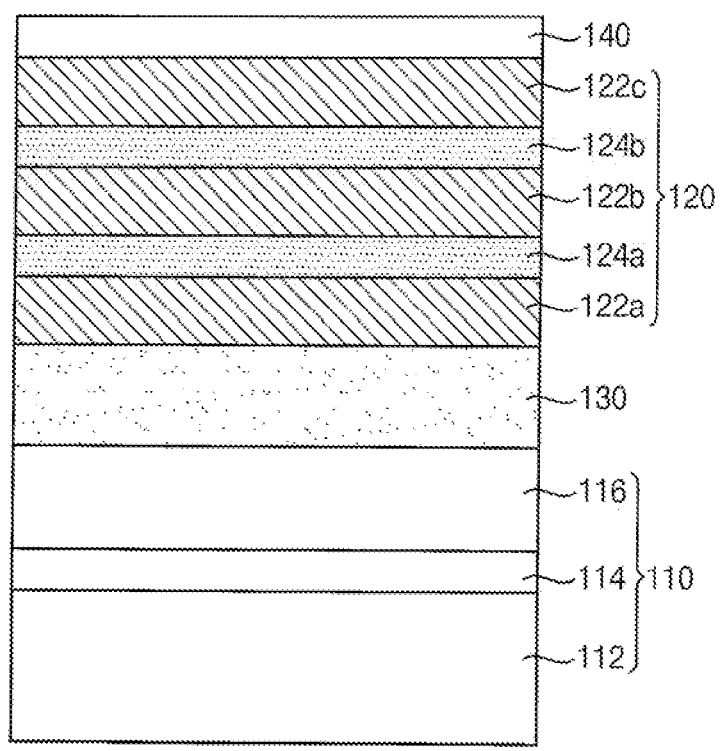
FIG. 7 is a cross-sectional view of an MTJ structure in an MRAM device in accordance with example embodiments.

FIG. 7 is a cross-sectional view of an MTJ structure in an MRAM device in accordance with example embodiments.

Referring to FIG. 7, the pinned layer 110 in the MTJ structure may include a lower magnetic layer 112, a non-magnetic layer 114, and an upper magnetic layer 116, for forming a synthetic anti-ferromagnetic (SAF) substance.

The synthetic antiferromagnetic (SAF) substance or material may have anti-ferromagnetic coupling (AFC) characteristics due to, e.g., a RKKY (Ruderman-Kittel-Kasuya-Yosida) interaction. In an implementation, the magnetization directions of the lower magnetic layer 112 and the upper magnetic layer 116 may be anti-parallel, so that a total magnetization amount of the pinned layer 110 may be minimized. Each of the lower magnetic layer 112 and the upper magnetic layer 116 may have a fixed magnetization direction.

The lower magnetic layer 112 and the upper magnetic layer 116 may include a ferromagnetic material. In an implementation, each of the lower magnetic layer 112 and the upper magnetic layer 116 may include amorphous rare earth element alloy, a multilayer in which a ferromagnetic metal (FM) and a non-magnetic metal (NM) are alternately stacked, a cobalt alloy, or a combination thereof. The non-magnetic layer 114 may be between the lower magnetic layer 112 and the upper magnetic layer 116. The non-magnetic layer 114 may include, e.g., ruthenium (Ru), chromium (Cr), platinum (Pt), palladium (Pd), iridium (Ir), rhodium (Rh), osmium (Os), rhenium (Re), gold (Au), copper (Cu), or a combination thereof.

Figure 8:
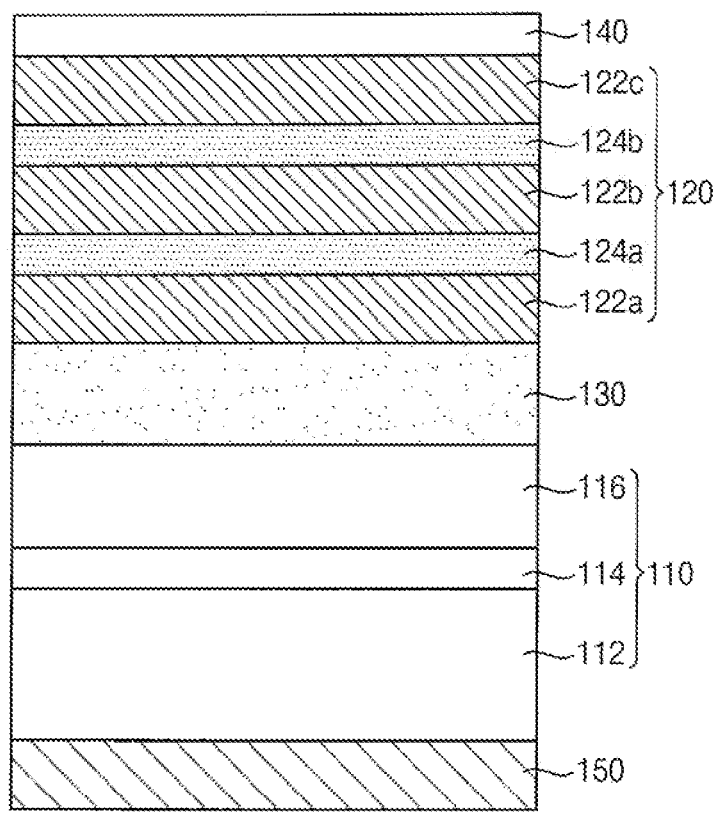
FIG. 8 is a cross-sectional view of an MTJ structure in an MRAM device in accordance with example embodiments.

FIG. 8 is a cross-sectional view of an MTJ structure in an MRAM device in accordance with example embodiments.

Referring to FIG. 8, the MTJ structure may further include a seed layer 150 under the pinned layer 110.

The perpendicular magnetic anisotropy of the pinned layer 110 may be enhanced by the seed layer 150. In an implementation, the magnetization direction of the pinned layer 110 may be fixed. The seed layer 150 may include, e.g., tantalum (Ta), ruthenium (Ru), titanium (Ti), palladium (Pd), platinum (Pt), magnesium (Mg), aluminum (Al), or combinations thereof.

Figure 9:
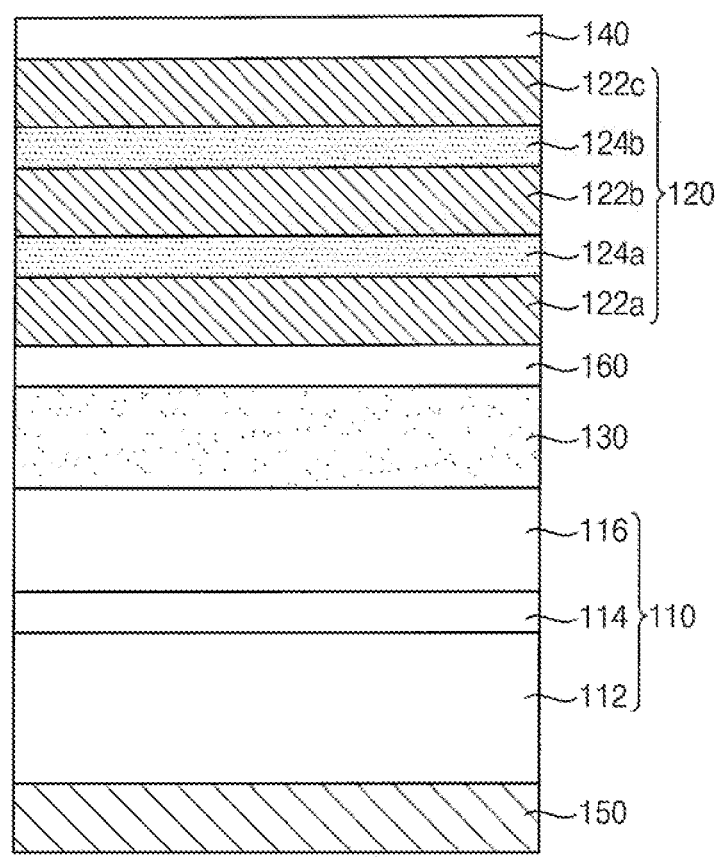
FIG. 9 is a cross-sectional view of an MTJ structure in an MRAM device in accordance with example embodiments.

FIG. 9 is a cross-sectional view of an MTJ structure in an MRAM device in accordance with example embodiments.

Referring to FIG. 9, a polarization enhancement layer 160 may be further included between the tunnel barrier layer 130 and the free layer structure 120. The polarization enhancement layer 160 may increase a spin polarization of the free layer structure 120. A magnetization direction of the polarization enhancement layer 160 may be parallel to the magnetization direction of the upper magnetic layer 116 in the pinned layer 110. The polarization enhancement layer 160 may include a ferromagnetic material. The polarization enhancement layer 160 may include a material having a high spin polarization rate and a low damping constant. In an implementation, the polarization enhancement layer 160 may include, e.g., cobalt (Co), nickel (Ni), iron (Fe), or a combination thereof.

Figure 10:
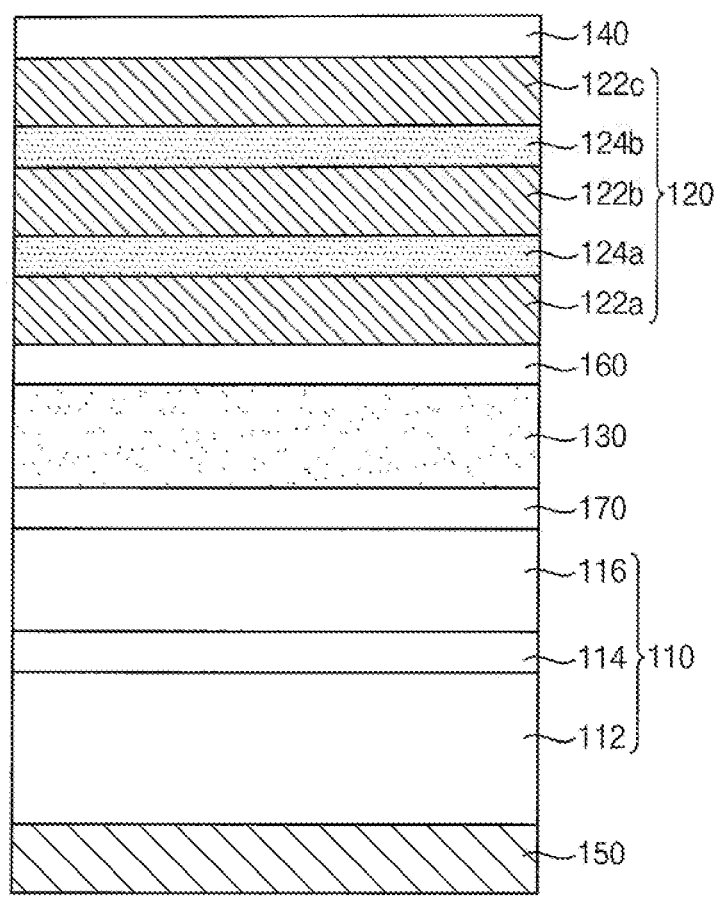
FIG. 10 is a cross-sectional view of an MTJ structure in an MRAM device in accordance with example embodiments.

FIG. 10 is a cross-sectional view of an MTJ structure in an MRAM device in accordance with example embodiments.

Referring to FIG. 10, the MRAM device may further include an amorphous layer 170 between the tunnel barrier layer 130 and the pinned layer 110. The amorphous layer 170 may help prevent a diffusion of materials constituting the pinned layer 110, so that the tunnel barrier layer 130 may be protected. In an implementation, the upper magnetic layer 116 included in the pinned layer 110 may include a crystalline material of, e.g., cobalt (Co) or a cobalt (Co) alloy, and the amorphous layer 170 may include a CoFeB amorphous material.

Figure 11:
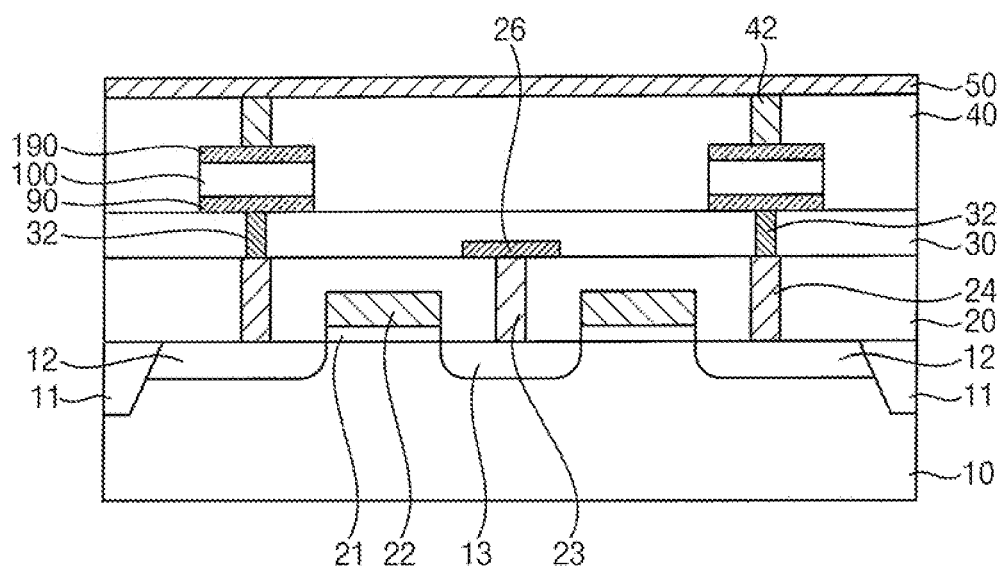
FIG. 11 is a cross-sectional view of an MRAM device in accordance with example embodiments.

FIG. 11 is a cross-sectional view of an MRAM device in accordance with example embodiments.

Referring to FIG. 11, the MRAM device may include a substrate 10, a selection device, and an MTJ structure 100.

An isolation pattern 11 may be in a trench of a substrate 10, and the substrate 10 may be divided into an active region and a field region by the isolation pattern.

The selection device may be a MOSFET, a diode, or a bipolar transistor. In an implementation, as shown in FIG. 11, the selection device may be the MOSFET. The selection device may include a source region 13, a drain region 12, a gate electrode 2,2 and a gate insulation layer 21. The gate electrode 22 may extend in one direction, and may serve as a word line.

A first insulating interlayer 20 may be on the substrate 10 to cover the selection device. A first contact plug 23 may pass through the first insulating interlayer 20, and may be electrically connected to the source region 13. In addition, a second contact plug 24 may pass through the first insulating interlayer 20, and may be electrically connected to the drain region 12.

A source line 26 may be formed on the first insulating interlayer 20 and the first contact plug 23.

A second insulating interlayer 30 may be formed on the first insulating interlayer 20, the second contact plug 24 and the source line 26. A lower electrode contact 32 may pass through the second insulating interlayer 30, and may be electrically connected to the second contact plug 24.

A lower electrode 90, an MTJ structure 100, and an upper electrode 190 may be on the lower electrode contact 32. In an implementation, the MTJ structure 100 may be any one of the embodiments described with reference to FIGS. 3 to 10.

A third insulating interlayer 40 may be on the second insulating interlayer 30 to cover the lower electrode 90, the MTJ structure 100 and the upper electrode 190. An upper electrode contact 42 may pass through the third insulating interlayer 40, and may be electrically connected to the upper electrode 190. A bit line 50 may be on the third insulating interlayer 40 and the upper electrode contact 42. The bit line 50 may be electrically connected to the MTJ structure 100 via, e.g., the upper electrode contact 42.

By way of summation and review, a memory device may be an STT-magnetic memory device that stores data using a spin transfer torque (STT) phenomenon. The STT-MRAM may have improved resistance distribution, improved current distribution and low operating power.

One or more embodiments may provide a spin-transfer torque-MRAM (STT-MRAM).

The MRAM device in accordance with example embodiments may be used as a memory device included in electronic products such as a mobile device, a memory card, or a computer.

One or more embodiments may provide an MRAM device having good characteristics.

In the MRAM device, a resistance distribution and a current distribution may be improved. Further, in the MRAM device, switching currents may be reduced, and a STT efficiency may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetoresistive random access memory device, comprising:
   a pinned layer;
   a tunnel barrier layer on the pinned layer;
   a free layer structure on the tunnel barrier layer, the free layer structure including a plurality of magnetic layers and a plurality of metal insertion layers between adjacent ones of the plurality of magnetic layers; and
   an upper oxide layer on the free layer structure,
   wherein:
   each metal insertion layer of the plurality of metal insertion layers includes a non-magnetic metal material doped with a magnetic material,
   the magnetic material doped into each metal insertion layer of the plurality of metal insertion layers has a structure including particles extending in a vertical direction between adjacent magnetic layers of the plurality of magnetic layers, and
   each metal insertion layer is spaced apart from each other metal insertion layer of the plurality of metal insertion layers.

2. The magnetoresistive random access memory device as claimed in claim 1, wherein each metal insertion layer of the plurality of metal insertion layers has a thickness of 2 Å to 10 Å.

3. The magnetoresistive random access memory device as claimed in claim 1, wherein the magnetic material included in each metal insertion layer of the plurality of metal insertion layers has a concentration of 5 at % to 40 at %.

4. The magnetoresistive random access memory device as claimed in claim 3, wherein the magnetic material included in each metal insertion layer of the plurality of metal insertion layers has a concentration of 20 at % to 40 at %.

5. The magnetoresistive random access memory device as claimed in claim 1, wherein the magnetic material doped into each metal insertion layer of the plurality of metal insertion layers is partially connected in a vertical direction.

6. The magnetoresistive random access memory device as claimed in claim 1, wherein:
   the magnetic material doped into each metal insertion layer of the plurality of metal insertion layers has a structure connected in a vertical direction, and the magnetic material has a magnetic bridge pattern vertically connected to adjacent ones of the plurality of magnetic layers.

7. The magnetoresistive random access memory device as claimed in claim 1, wherein each metal insertion layer of the plurality of metal insertion layers is continuously on one magnetic layer of the plurality of magnetic layers such that adjacent magnetic layers of the plurality of magnetic layers are separated by one metal insertion layer of the plurality of metal insertion layers.

8. The magnetoresistive random access memory device as claimed in claim 1, wherein a sum of thicknesses of the plurality of magnetic layers included in the free layer structure is greater than a sum of thicknesses of the plurality of metal insertion layers included in the free layer structure.

9. The magnetoresistive random access memory device as claimed in claim 1, wherein:
the non-magnetic metal material included in each metal insertion layer of the plurality of metal insertion layers includes molybdenum, tungsten, tantalum, ruthenium, zirconium, niobium, yttrium, scandium, vanadium, chromium, tellurium, or hafnium, and
the magnetic material doped into the non-magnetic metal material includes iron, cobalt, gadolinium or nickel.

10. A magnetoresistive random access memory device, comprising:
a pinned layer;
a tunnel barrier layer on the pinned layer;
a free layer structure on the tunnel barrier layer; and
an upper oxide layer on the free layer structure;
wherein the free layer structure includes:
a first magnetic layer,
a first metal insertion layer on the first magnetic layer, the first metal insertion layer including a first non-magnetic metal material doped with a first magnetic material,
a second magnetic layer on the first metal insertion layer,
a second metal insertion layer on the second magnetic layer, the second metal insertion layer including a second non-magnetic metal material doped with a second magnetic material, and
a third magnetic layer on the second metal insertion layer; and
wherein the first magnetic material doped into the first metal insertion layer has a structure including particles extending in a vertical direction between the first magnetic layer and the second magnetic layer, and
wherein the second magnetic material doped into the second metal insertion layer has a structure including particles extending in a vertical direction between the second magnetic layer and the third magnetic layer.

11. The magnetoresistive random access memory device as claimed in claim 10, wherein:
the first magnetic material doped into the first metal insertion layer is vertically connected to the first magnetic layer and the second magnetic layer, and
the second magnetic material doped into the second metal insertion layer is vertically connected to the second magnetic layer and the third magnetic layer.

12. The magnetoresistive random access memory device as claimed in claim 10, wherein each of the first metal insertion layer and the second metal insertion layer has a thickness of 2 Å to 10 Å.

13. The magnetoresistive random access memory device as claimed in claim 10, wherein:

the first magnetic material included in the first metal insertion layer has a concentration of 5 at % to 40 at %, and
the second magnetic material included in the second metal insertion layer has a concentration of 5 at % to 40 at %.

14. The magnetoresistive random access memory device as claimed in claim 10, wherein:
the first non-magnetic metal material included in the first metal insertion layer and the second non-magnetic metal material included in the second metal insertion layer each include molybdenum, tungsten, tantalum, ruthenium, zirconium, niobium, yttrium, scandium, vanadium, chromium, tellurium, or hafnium, and
the first magnetic material doped into the first non-magnetic metal material and the second magnetic material doped into the second non-magnetic metal material each include iron, cobalt, gadolinium or nickel.

15. The magnetoresistive random access memory device as claimed in claim 10, wherein the upper oxide layer includes magnesium oxide, magnesium aluminum oxide, hafnium oxide, zirconium oxide, aluminum oxide, tantalum oxide, or iridium oxide.

16. The magnetoresistive random access memory device as claimed in claim 10, wherein the upper oxide layer has a thickness of 2 Å to 15 Å.

17. A magnetoresistive random access memory device, comprising:
a pinned layer;
a tunnel barrier layer on the pinned layer;
a free layer structure on the tunnel barrier layer; and
an upper oxide layer on the free layer structure,
wherein the free layer structure includes:
a first magnetic layer having perpendicular magnetic anisotropy and including a ferromagnetic material,
a first metal insertion layer on the first magnetic layer, the first metal insertion layer including a first non-magnetic metal material doped with a first magnetic material,
a second magnetic layer on the first metal insertion layer, the second magnetic layer having perpendicular magnetic anisotropy and including a ferromagnetic material,
a second metal insertion layer on the second magnetic layer, the second metal insertion layer including a second non-magnetic metal material doped with a second magnetic material, and
a third magnetic layer on the second metal insertion layer, the third magnetic layer having perpendicular magnetic anisotropy and including a ferromagnetic material; and
wherein the first magnetic material doped into the first metal insertion layer has a structure including particles extending in a vertical direction between the first magnetic layer and the second magnetic layer, and
wherein the second magnetic material doped into the second metal insertion layer has a structure including particles extending in a vertical direction between the second magnetic layer and the third magnetic layer.

18. The magnetoresistive random access memory device as claimed in claim 17, wherein:
the first magnetic material doped into the first metal insertion layer is partially connected in a vertical direction, and
the second magnetic material doped into the second metal insertion layer is partially connected in a vertical direction.

19. The magnetoresistive random access memory device as claimed in claim 17, wherein:
- the first magnetic material doped into the first metal insertion layer has a vertically connected structure,
- the second magnetic material doped into the second metal insertion layer has a vertically connected structure
- the first magnetic material doped into the first metal insertion layer serves as a first magnetic bridge pattern connecting the first magnetic layer and the second magnetic layer in a vertical direction, and
- the second magnetic material doped into the second metal insertion layer serves as a second magnetic bridge pattern connecting the second magnetic layer and the third magnetic layer in the vertical direction.

20. The magnetoresistive random access memory device as claimed in claim 17, wherein the upper oxide layer has a thickness of 2 Å to 15 Å.

\* \* \* \* \*